US009960759B2

(12) United States Patent
Garg et al.

(10) Patent No.: US 9,960,759 B2
(45) Date of Patent: May 1, 2018

(54) N-BIT COMPARE LOGIC WITH SINGLE ENDED INPUTS

(71) Applicant: QUALCOMM Incorporated, San Diego, CA (US)

(72) Inventors: Manish Garg, Cary, NC (US); Ramasamy Adaikkalavan, Morrisville, NC (US)

(73) Assignee: QUALCOMM Incorporated, San Diego, CA (US)

( * ) Notice: Subject to any disclaimer, the term of this patent is extended or adjusted under 35 U.S.C. 154(b) by 195 days.

(21) Appl. No.: 14/860,713

(22) Filed: Sep. 22, 2015

(65) Prior Publication Data

US 2017/0047918 A1 Feb. 16, 2017

Related U.S. Application Data

(60) Provisional application No. 62/205,604, filed on Aug. 14, 2015.

(51) Int. Cl.
*G06F 12/08* (2016.01)
*G06F 7/02* (2006.01)
(Continued)

(52) U.S. Cl.
CPC ............... *H03K 5/24* (2013.01); *G06F 7/026* (2013.01); *G06F 12/0802* (2013.01); *H03K 19/20* (2013.01); *G06F 2212/60* (2013.01)

(58) Field of Classification Search
CPC combination set(s) only.
See application file for complete search history.

(56) References Cited

U.S. PATENT DOCUMENTS 4,450,432 A 5/1984 Schmidtpott et al.
4,648,059 A 3/1987 Gregorcyk
(Continued)

FOREIGN PATENT DOCUMENTS

EP 0939490 A2 9/1999
GB 1316061 A 5/1973
KR 100212145 B1 8/1999

OTHER PUBLICATIONS

Dong X., et al., "Design of a 4-Bit Comparator," Department of Electrical and Computer Engineering, Concordia University, Mar. 26, 2015, pp. 1-35.
(Continued)

*Primary Examiner* — Aracelis Ruiz
(74) *Attorney, Agent, or Firm* — Muncy, Geissler, Olds & Lowe, P.C./Qualcomm

(57) ABSTRACT

Disclosed systems and methods relate to comparison of a first number and a second number. A comparator receives first and second single-ended inputs (i.e., not represented in differential format), which may be n-bits wide, wherein the first input is an inverted version of the first number and the second input is a true version of the second number. A partial match circuit is implemented to generate a partial match output based only on the first single-ended input and the second single-ended input. A partial mismatch circuit is implemented to generate a partial mismatch output based only on the first single-ended input and the second single-ended input. A comparison output circuit is implemented to generate a comparison output of the first and second numbers based on the partial match output and the partial mismatch output.

15 Claims, 5 Drawing Sheets

(51) Int. Cl.
*H03K 5/24* (2006.01)
*H03K 19/20* (2006.01)
*G06F 12/0802* (2016.01)

(56) References Cited

U.S. PATENT DOCUMENTS

| | | |
|---|---|---|
| 5,881,076 A | 3/1999 | Murray |
| 6,177,862 B1 | 1/2001 | Sakata |
| 6,353,646 B1 | 3/2002 | Rossignol |
| 6,385,070 B1 * | 5/2002 | Peterson ................ G11C 15/04 365/189.07 |
| 7,388,470 B2 | 6/2008 | Chae |

OTHER PUBLICATIONS

International Search Report and Written Opinion—PCT/US2016/041903—ISA/EPO—dated Oct. 12, 2016.

* cited by examiner

N-BIT COMPARE LOGIC WITH SINGLE ENDED INPUTS

CLAIM OF PRIORITY UNDER 35 U.S.C. § 119

The present Application for Patent claims priority to Provisional Application No. 62/205,604 entitled "N-BIT COMPARE LOGIC WITH SINGLE-ENDED INPUTS" filed Aug. 14, 2015, and assigned to the assignee hereof and hereby expressly incorporated by reference herein.

FIELD OF DISCLOSURE

Disclosed aspects relate to integrated circuits for implementing compare functions. More specifically, exemplary aspects pertain to comparators which can operate on single-ended or non-differential inputs.

BACKGROUND

Comparators are used in a variety of applications. For example, comparators may be used for comparison of two numbers or operands in processing systems. For example, memory structures like caches may use comparators for comparing a desired address (or portion thereof) to be searched, with addresses (or portions thereof) stored in the caches (also known as "tags") to determine whether the desired address is present (cache hit) or not present in the cache (cache miss). Some arithmetic and logic units (ALUs) of processors may use comparators for comparison operations such as greater-than, less-than, equal-to, etc. In some cases, comparators may also be used to test conditions (e.g., for conditional instructions), set predicate registers (for predicated instructions), etc.

Comparators may be implemented using hardware, for example, with specially designed circuits for improving the speed of comparison of two multi-bit numbers. In this regard, wide (e.g., multi-bit) comparators are conventionally implemented using domino complementary metal-oxide semiconductor (CMOS), pseudo-static CMOS, skewed CMOS, or similar technologies as known in the art. In these conventional implementations, the comparators receive the numbers to be compared in a differential form (i.e., true and complement versions of the numbers are be provided as inputs). Conventionally, the comparators are designed as domino logic (e.g., cascaded structures with multiple stages). Correct functionality of domino logic based comparators is achieved when the differential inputs are free of glitches. Achieving glitch-free inputs is difficult.

Considering the above example application of comparators in cache structures, the stored addresses or tags in the cache are single-ended domino signals. As used herein, single-ended signals refer to signals which are not differential. However, in order to be used as an input to a comparator for comparing the tags with a desired address to be searched, the single-ended domino inputs in their native form need to be converted to differential domino inputs. Conversion to differential domino input may entail providing the native single-ended input as a "true" part and generating an inverted version of the single-ended input for a "complement" part. To generate the complement part, the true part may be inverted and combined with a timed clock in order to generate a glitch-free domino signal. While the generation of the complement part may use expensive logic (in terms of area and power), there is also potential for race conditions to develop between the clock used by the comparator and the timed clock used to generate the complement part. Increasing process variations can lead to exacerbating the race conditions, in turn calling for higher timing margins, to meet timing constraints for the comparator circuits under varying process-voltage-temperature (PVT) corners or PVT conditions.

Accordingly, there is a need in the art to avoid the drawbacks of differential domino inputs in conventional implementations of comparators.

SUMMARY

Exemplary embodiments of the invention are directed to systems and methods relate to comparison of a first number and a second number. A comparator receives first and second single-ended inputs (i.e., not represented in differential format), which may be n-bits wide, wherein the first input is an inverted version of the first number and the second input is a true version the second number. A partial match circuit is implemented to generate a partial match output based only on the first single-ended input and the second single-ended input. A partial mismatch circuit is implemented to generate a partial mismatch output based only on the first single-ended input and the second single-ended input. A comparison output circuit is implemented to generate a comparison output of the first and second numbers based on the partial match output and the partial mismatch output.

For example, an exemplary aspect includes an apparatus comprising a first single-ended input and a second single-ended input. A partial match circuit is configured to generate a partial match output based only on the first single-ended input and the second single-ended input. A partial mismatch circuit is configured to generate a partial mismatch output based only on the first single-ended input and the second single-ended input. The apparatus also includes a comparison output circuit is configured to generate a comparison output based on the partial match output and the partial mismatch output.

Another exemplary aspect relates to a method of method of comparing, the method comprising receiving a first single-ended input, receiving a second single-ended input, determining a partial match output based only on the first single-ended input and the second single-ended input, determining a partial mismatch output based only on the first single-ended input and the second single-ended input, and determining a comparison output based on the partial match output and the partial mismatch output.

Yet another exemplary aspect pertains to an apparatus comprising a first single-ended input, a second single-ended input, means for determining a partial match output based only on the first single-ended input and the second single-ended input, means for determining a partial mismatch output based only on the first single-ended input and the second single-ended input, and means for determining a comparison output based on the partial match output and the partial mismatch output.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1A:
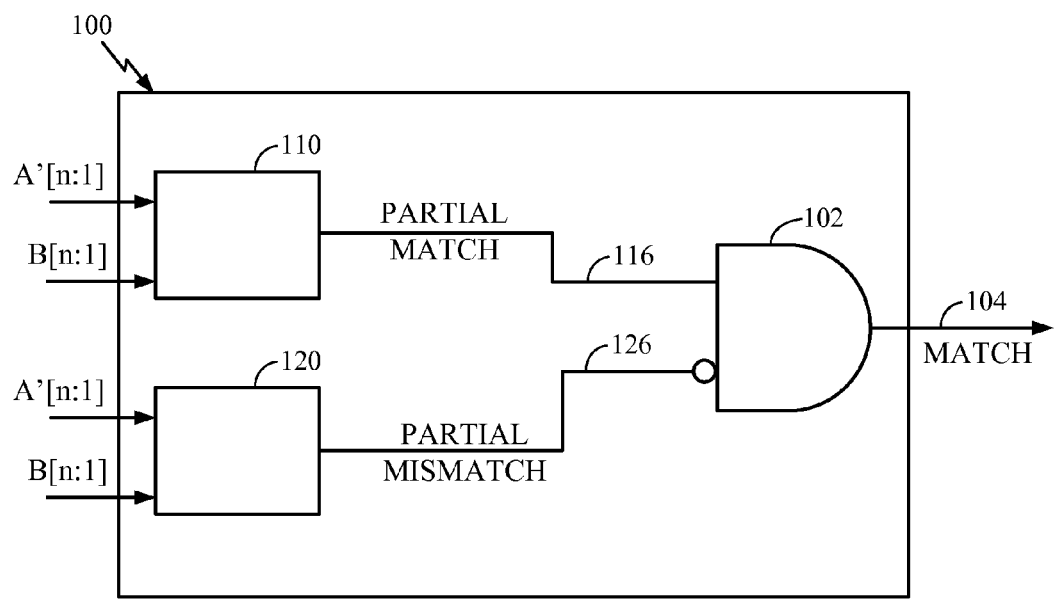
FIGS. 1A-C illustrate an exemplary comparator.
Figure 1A:
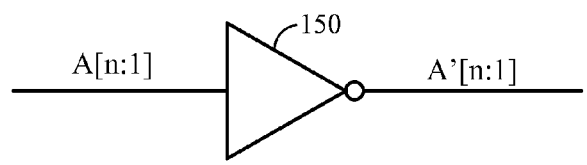

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects of this disclosure pertain to designs of comparators configured to accept and operate on single-ended inputs. For example, an exemplary comparator includes hardware or circuitry designed to receive single-ended first and second inputs and generate a comparison of the first and second inputs (e.g., an output or indication of whether the first and second inputs are the same or different). The first and second inputs can be n-bits wide, where n may be a positive integer. The exemplary comparator logic can be designed without true and complement versions or differential formats of the first and second inputs. Rather, the comparator can be designed with only single-ended, true (i.e. non-inverted) versions, of both inputs (although, it will be seen in the detailed description below that one of the inputs, e.g., the first input, can be an inverted version of a number to be compared with the second input, but the inversion of the number is performed outside the comparator, and so does not form part of the exemplary comparator logic).

The exemplary comparator can also be designed with domino CMOS, skewed CMOS, pseudo-static CMOS, etc., and so, is compatible with existing technology. Although not shown, the first input can pertain to stored address (e.g., tag data) of a cache and the second input can pertain to a desired address to be searched in the cache, where the comparator is configured to compare the stored address or tag data to the desired address to determine if there is a hit or miss in the cache.

By way of background, algorithms which support the design of the exemplary comparator with single-ended inputs will first be described. Consider first that A and B are single-bit, single-ended numbers. A one-bit match function to determine if A and B are equal or different can be represented by the logical expression: "(A.B+A'.B')," wherein A' and B' represent complements (inverted values) of A and B respectively, the symbol "." represents an AND function and the symbol "+" represents an OR function. The match function "(A.B+A'.B') is high or "1" if A and B are equal, and is low or "0" if A is not equal to B. For purposes of this disclosure, the match function can be recast into its equivalent form: "(A+B').(A'+B)". Using this alternative representation of the one-bit match function, "(A+B').(A'+B)," for one-bit inputs A and B as a starting point, an n-bit match function for n-bit inputs A and B will now be described, where n can be a positive integer. Although exemplary aspects cover multi-bit comparators, i.e., where n is an integer of value greater than or equal to 2, the simpler case where n=1 is not excluded. Thus, exemplary aspects are generally described for n-bit comparators where n can be an integer whose value can be greater than or equal to 1.

A conventional n-bit match is provided by the logical expression: "$\Pi\{(A[i]+ B'[i]).(A'[i]+B[i])\}$" for i=1 to n (where "$\Pi$" represents a bitwise product). As can be appreciated, this conventional n-bit match function uses differential values of A and B (i.e., true and complement values of A comprising A[i] and A'[i] for i=1 to n, as well as true and complement values of B comprising B[i] and B'[i] for i=1 to n). Aforementioned conventional comparators may implement the conventional n-bit match function. Logic to evaluate component expressions "(A[i]+B'[i])" and "(A'[i]+B[i])" for the conventional n-bit match function may involve 2n exclusive-or (XOR) gates as known in the art. XOR gates are expensive and consume large area and power, which means that 2n XOR gates contributes to a significant consumption of area and power when the conventional n-bit match function is implemented in hardware.

In order to avoid the expenses incurred by the conventional n-bit match function which relies on the differential values of A and B, the conventional n-bit match function is reformulated using the above-mentioned technique of recasting the 1-bit match function "(A.B+A'.B')" to its equivalent form: "(A+B').(A'+B)". The following logical manipulations explain how the conventional n-bit match function is converted to an alternative n-bit match function termed as "Equation 1" which is used to implement an exemplary comparator with single-ended n-bit inputs rather than differential n-bit inputs. (In the following equations, "$\Sigma$" represents a bitwise summation)

$$\prod \{(A[i]+B'[i]) \cdot (A'[i]+B[i])\}'' \text{ for } i = \qquad \text{(Equation 1)}$$

$$1 \text{ to } n = \prod (A[i]+B'[i]) \cdot \prod (A'[i]+B[i]) \text{ for } i =$$

$$1 \text{ to } n = \prod (A[i]+B'[i]) \cdot \prod (A[i] \cdot B'[i])' \text{ for } i =$$

$$1 \text{ to } n = \prod (A[i]+B'[i]) \cdot \text{Not}\left(\sum (A[i] \cdot B'[i])\right)$$

$$\text{for } i = 1 \text{ to } n = \prod (A'[i] \cdot B[i])' \cdot$$

$$\text{Not}\left(\sum (A'[i]+B[i])'\right) \text{ for } i = 1 \text{ to } n$$

Considering Equation 1, it is seen that the n-bit match function in the formulation of Equation 1 uses only the complement value of A (i.e., A'[i] for values of i=1 to n) and only the true value of B (i.e., B[i] for values of i=1 to n), rather than relying on both true and complement values of both A and B as in the case of the conventional n-bit match function. Thus, an exemplary comparator is designed to implement Equation 1 in order to generate the n-bit match function for n-bit single-ended inputs A'[i] and B[i] for i=1 to n. It will be understood that even though obtaining the complement of A[i] to generate input A'[i] for the comparator may involve an n-bit inverter, this inverter can be provided outside the comparator, and moreover, does not need to be synchronized or combined with a timed clock to provide a glitch-free inverted version of A[i] because only one input, i.e., A'[i] is fed into the comparator in order to implement the match function of Equation 1.

A circuit implementation of Equation 1 can include two domino (or skewed CMOS) circuits. A first circuit can implement a "partial match function," which refers to the logical expression Π(A', [i].B[i])' in this disclosure, and second circuit can implement a "partial mismatch function," which refers to the logical expression Σ(A'[i]+B[i])'. For a particular combination of n-bit values A'[i] and B[i], the comparator's output would indicate a match (i.e., A[i]=B[i] for i=1 to N) if the first circuit evaluates to "1" or generates a partial match output which is high, indicating that there is a partial match, and if the second circuit evaluates to "0" or generates a partial mismatch output which is low, indicating that there was not a partial mismatch. If the above combination of evaluations are not generated by the partial match and partial mismatch circuits, then the comparator's output would indicate a mismatch.

Figure 1B:
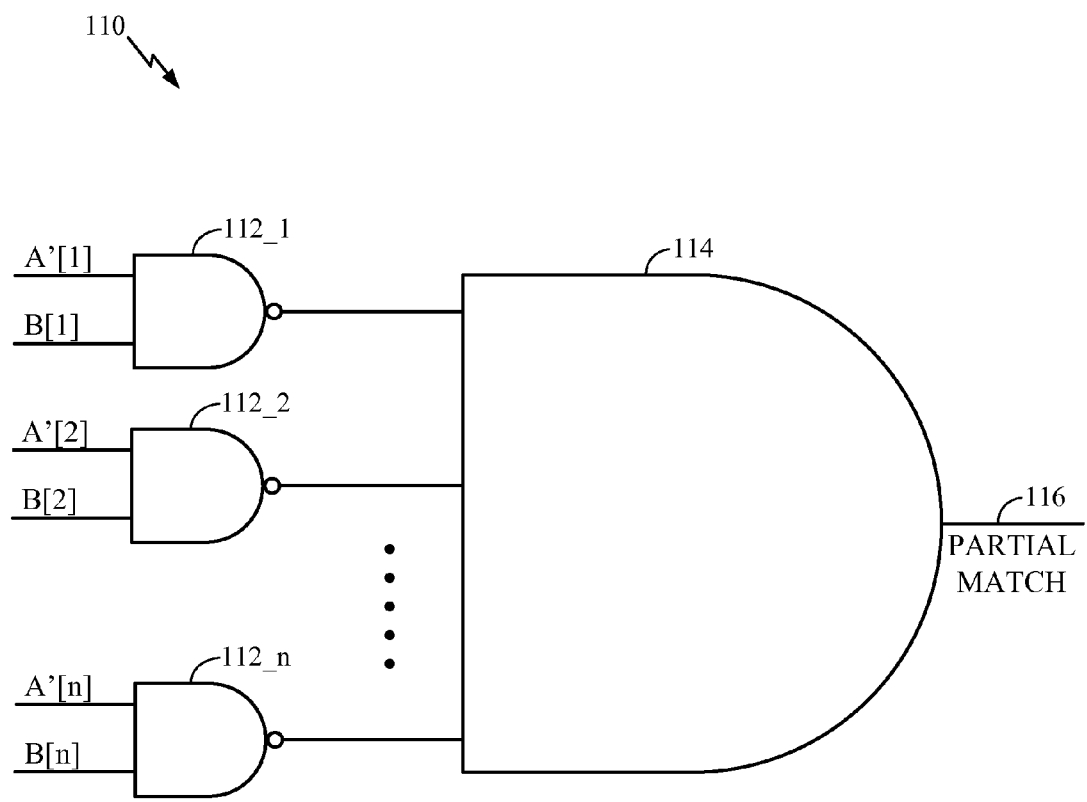
Figure 1C:
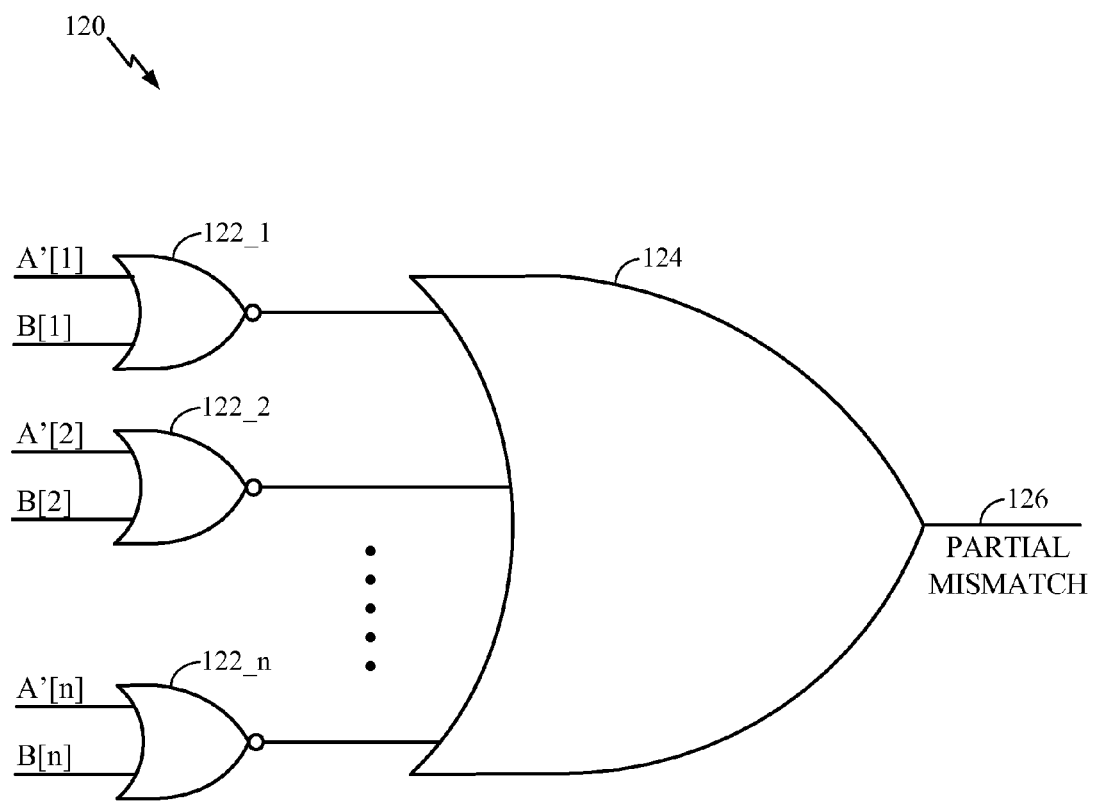

With reference now to FIGS. 1A-C, a schematic diagram of exemplary comparator 100 is shown. Comparator 100 may be configured to implement the match function of Equation 1 above in exemplary aspects. Accordingly, comparator 100 is configured to receive two single-ended n-bit inputs (where "n" is a positive integer, i.e., an integer whose value can be greater than or equal to 1). A first number A[n:1] is to be compared to a second number B[n:1]. A first n-bit input provided to comparator 100 is A'[n:1], which is an inverted version (bitwise inversion) of the first number A[n:1]; while a second n-bit input provided to comparator 100 is a true version (i.e., same as) the second number B[n:1]. An n-bit inverter 150 can be provided to invert the first number A[n:1], and provide the inverted version of the first number A[n:1] as the first input A'[n:1]. The n-bit inverter 150 can be separate from comparator 100 and is therefore shown outside comparator 100 in FIG. 1. First and second n-bit inputs A'[n:1] and B[n:1] are single-ended (i.e., not differential) and neither of them needs to be synchronized to a clock, and correspondingly, circuits to make the first and second inputs glitch-free can be avoided for comparator 100.

Comparator 100 includes partial match circuit 110 (FIG. 1B) and partial mismatch circuit 120 (FIG. 1C). Partial match circuit 110 implements logic to determine an evaluation of the partial match function Π(A'[i].B[i])' and generates partial match output 116. Partial mismatch circuit 120 implements logic to determine an evaluation of the partial mismatch function Σ(A'[i]+B[i])' and generates partial mismatch output 126. Partial match output 116 and an inverted value of partial mismatch output 126 are provided to AND gate 102. AND gate 102 generates match output 104, which is a comparison of two numbers: the first number A[n:1] (where the first input A'[n:1] is an inverted version of the first number A[n:1]) and the second number B[n:1] (where the second input B[n:1] is a true version of the second number B[n:1]). Specifically, AND gate 102 is configured to implement an AND function of the partial match output with an inverted value of the partial mismatch output.

With reference to FIG. 1B, partial match circuit 110 is explained in further detail. In general, partial match circuit 110 is configured to determine and provide as output, partial match output 116, which is a bitwise product of NAND functions of n-bits of the first input A'[n:1] with corresponding n-bits of the second input B[n:1]. For example, in FIG. 1B, partial match circuit 110 includes n NAND gates 112_1 to 112_n, which accept one bit each of respective first and second n-bit inputs A'[n:1] and B[n:1] (to implement (A'[i].B[i])' for i=1 to n). Outputs of the n NAND gates 112_1 to 112_n are provided to n-bit AND gate 114 to implement a bitwise AND function for determining an evaluation of the bitwise product of the outputs of the n NAND gates 112_1 to 112_n (i.e., Π(A'[i].B[i])') and generate partial match output 116. Although n-bit AND gate 114 is shown as one consolidated logic block in FIG. 1B, in practice, n-bit AND gate 114 may comprise a tree or hierarchical structure of AND gates with smaller number of inputs each in order to determine the evaluation of the bitwise product or bitwise AND of the outputs of the n NAND gates 112_1 to 112_n.

With reference to FIG. 1C, partial mismatch circuit 120 is explained in further detail. In general, partial mismatch circuit 120 is configured to determine and provide as output, partial mismatch output 126, which is a bitwise summation of NOR functions of n-bits of the first input A'[n:1] with corresponding n-bits of the second input B[n:1]. For example, in FIG. 1C, partial mismatch circuit 120 includes n NOR gates 122_1 to 122_n, which accept one bit each of respective first and second n-bit inputs A'[n:1] and B[n:1] (to implement (A'[i]+B[i])' for i=1 to n). Outputs of then NOR gates 122_1 to 122_n are provided to n-bit OR gate 124 to implement bitwise OR of the outputs of the n NOR gates 122_1 to 122_n (i.e., Σ (A'[i]+B[i])') to generate partial mismatch output 126. Although n-bit OR gate 124 is shown as one consolidated logic block in FIG. 1C, in practice, n-bit OR gate 124 may comprise a tree or hierarchical structure of OR gates with smaller number of inputs each in order to generate the bitwise summation or bitwise OR of the outputs of the n NOR gates 122_1 to 122_n.

Moreover, it will be recognized that circuit implementations of an OR gate may comprise using a NOR gate whose output is coupled to an inverter. Thus, in an alternative implementation (not shown explicitly), rather than use n-bit OR gate 124 whose output, i.e., partial mismatch output 126 of partial mismatch circuit 120, is inverted before being fed to AND gate 102 (see schematic of comparator 100 in FIG. 1), n-bit OR gate 124 may be replaced by an n-bit NOR gate (not shown), which can avoid a following inversion of its output before being fed to AND gate 102. Numerous other such circuit variations are possible. Accordingly, it will be understood that the above description of the implementation of comparator 100 is directed to the functionality of exemplary aspects. Skilled persons will recognize particular circuit implementations and means for performing the functions described herein, based on the description of exemplary features.

The schematic representation of comparator 100 in FIGS. 1A-C is applicable to implementations of comparator 100 using technology such as domino CMOS, skewed CMOS, pseudo-static CMOS. For example, partial match circuit 110 and partial mismatch circuit 120 can comprise domino CMOS, skewed CMOS, pseudo-static CMOS technology, or the like, without departing from the scope of this disclosure. Further, as previously explained, the first input A'[n:1] is an inverted version of the first number A[n:1], where the first number A[n:1] can comprise a stored address or tag data of a cache (e.g., the first number A[n:1] can comprise the stored address, and A'[n:1] is provided as the first input to comparator 100 after A[n:1] is inverted by bitwise inverter 150). The second input B[n:1] can be a true version of the second number B[n:1], and can comprise a desired address to be searched in the cache. Thus, the exemplary comparison provides a determination of a hit or miss in the cache for the desired address.

Figure 2:
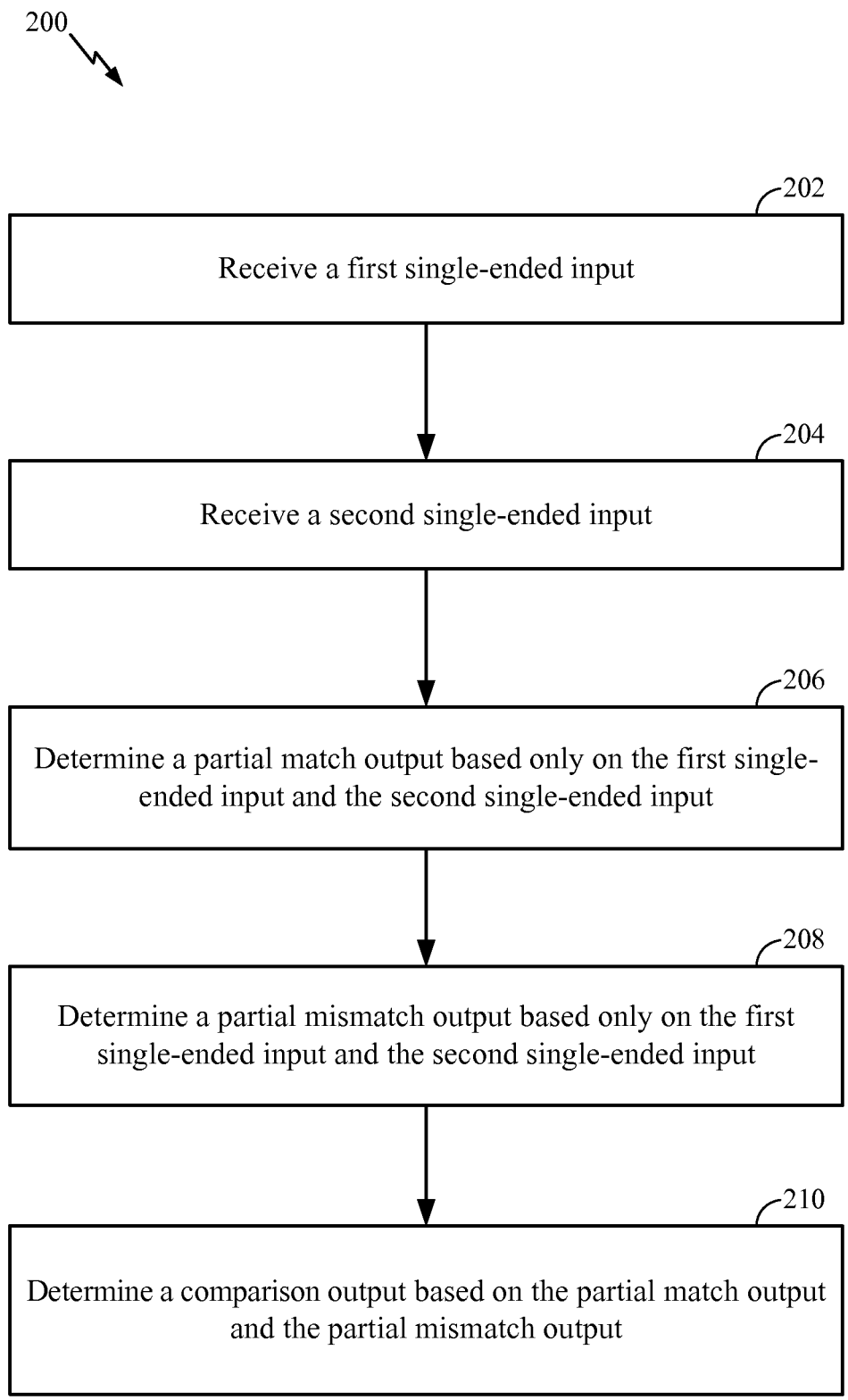
FIG. 2 illustrates a method of comparing, according to an aspect of this disclosure.

Accordingly, it will be appreciated that exemplary aspects include various methods for performing the processes, functions and/or algorithms disclosed herein. For example, FIG. 2 illustrates method 200 of comparing (e.g., a first number (e.g., A[n:1]) and a second number (e.g., B[n:1])). Method 200 can be implemented in comparator 100, for example.

In Block 202, method 200 includes receiving a first single-ended input (e.g., the first input A'[n:1] of FIGS. 1A-C comprising n-bits, where n is a positive integer). In exemplary aspects, the first input A'[n:1] can be an inverted version of the first number A[n:1]. In some cases, the first number can be inverted in an n-bit inverter to obtain the first input.

In Block 204, method 200 includes receiving a second single-ended input (e.g., the second input B[n:1] of FIGS. 1A-C comprising n-bits. In exemplary aspects, and the second input B[n:1] is a true version of the second number B[n:1]).

In Block 206, method 200 includes determining a partial match output based only on the first single-ended input and the second single-ended input (e.g., determining, in partial match circuit 110, a partial match output as a bitwise product (e.g., using n-bit AND gate 114) of NAND functions of n-bits of the first input with corresponding n-bits of the second input (e.g., using n NAND gates 112_1 to 112_n)).

In Block 208, method 200 includes determining a partial mismatch output based only on the first single-ended input and the second single-ended input (e.g., determining, in partial mismatch circuit 120, a partial mismatch output as a bitwise summation (e.g., using n-bit OR gate 124) of NOR functions of n-bits of the first input with corresponding n-bits of the second input (e.g., using n NOR gates 122_1 to 122_n)).

In Block 210, method 200 includes determining a comparison output based on the partial match output and the partial mismatch output (e.g., determining a comparison of a first number and a second number as an AND function (e.g., in AND gate 102) of the partial match output (e.g., partial match output 116) and an inverted value of the partial mismatch output (e.g., partial mismatch output 126)). The comparison can, for example, if the first number A[n:1] is equal to or not equal to the second number B[n:1].

In exemplary aspects, the partial match output and partial mismatch output in method 200 can be determined using domino CMOS, skewed CMOS, or pseudo-static CMOS technology. For example, the partial match output and the partial mismatch output in method 200 may be determined with only true (i.e. non-inverted) versions of the first and second inputs. The comparison of method 200 can indicate a hit or a miss in a cache in some examples (e.g., a hit or miss indication may be based on the comparison of the first number and the second number, where, for example, the first number comprises a stored address or tag data of a cache and the second number comprises a desired address to be searched in the cache).

Additionally, it will also be seen that exemplary aspects relate to various means for performing the functions disclosed herein. For example, it will be seen that exemplary aspects include an apparatus such as comparator 100, which comprises a first single-ended input (e.g., A'[n:1] comprising n-bits, wherein n is a positive integer), and a second single-ended input (e.g., B[n:1] comprising n-bits). The first single-ended input can be an inverted version of a first number A[n:1] and the second single-ended input can be a true version of a second number B[n:1], wherein the apparatus can include means for comparing the first number and the second number. The apparatus can include, for example, means for determining a partial match output based only on the first single-ended input and the second single-ended input (e.g., partial match circuit 110 for determining a bitwise product of NAND functions of n-bits of the first input with corresponding n-bits of the second input), and means for determining a partial mismatch output based only on the first single-ended input and the second single-ended input (e.g., partial mismatch circuit 120 for determining a bitwise summation of NOR functions of n-bits of the first input with corresponding n-bits of the second input). The apparatus further includes means for determining a comparison output based on the partial match output and the partial mismatch output (e.g., AND gate 102 to perform an AND function of the output of the partial match output and an inverted value of the partial mismatch output).

Figure 3:
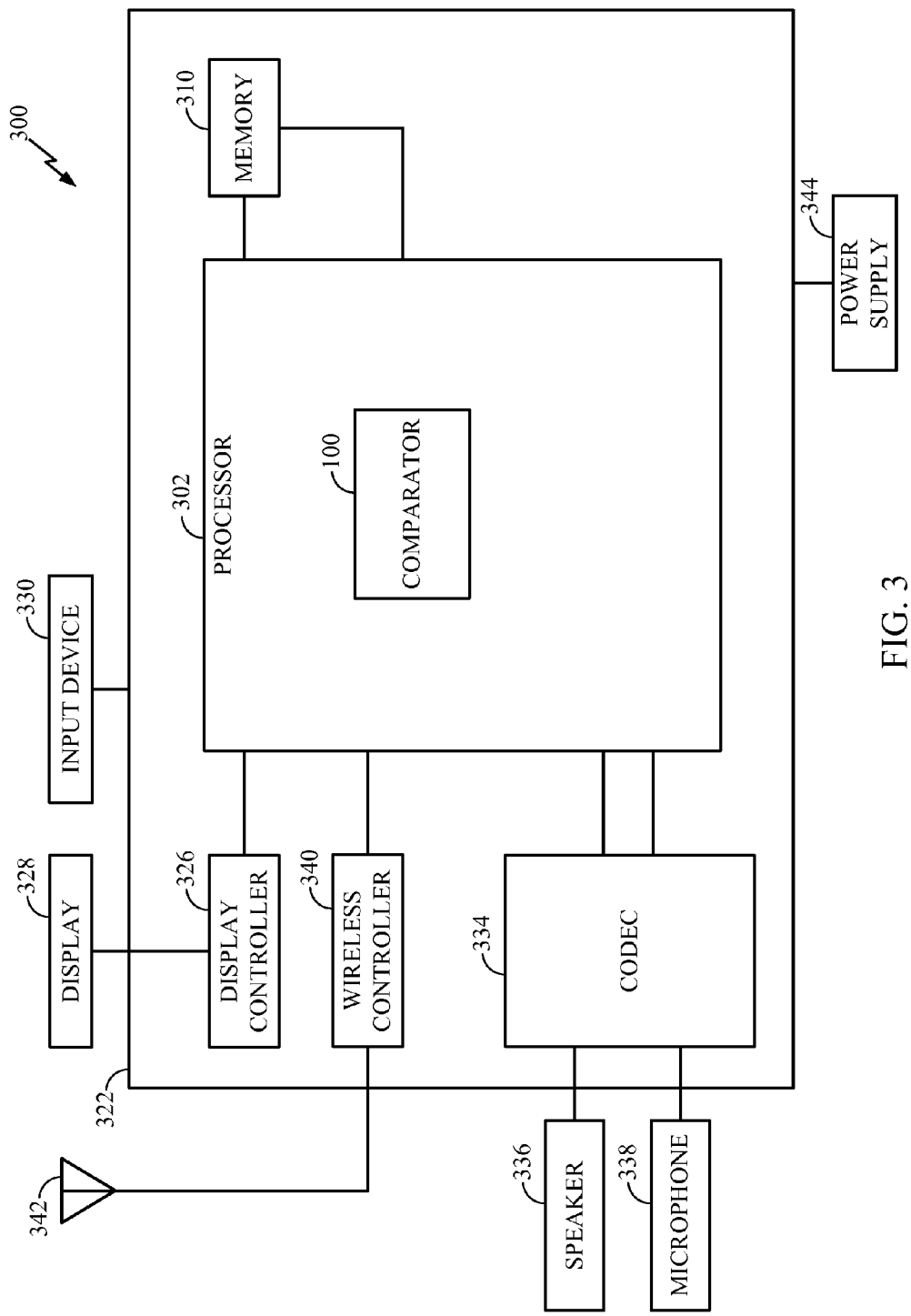
FIG. 3 illustrates an exemplary wireless device in which an aspect of the disclosure may be advantageously employed.

An example apparatus in which comparator 100 may be deployed will now be discussed in relation to FIG. 3. FIG. 3 shows a block diagram of wireless device 300 that is configured according to exemplary aspects. Wireless device 300 includes processor 302, which can be, for example, a digital signal processor (DSP) or any general purpose processor or central processing unit (CPU) as known in the art. In FIG. 3, comparator 100 is shown as a block within processor 302 while omitting the details of comparator 100 shown in FIGS. 1A-C, for the sake of clarity. Comparator 100 can be used to implement comparisons for arithmetic and logical units of processor 302, for example. Although not shown, a similar comparator as comparator 100 can also be included in logic to compare search addresses with tag data of a cache, or in memory control logic of memory 310, for example. Processor 302 may be communicatively coupled to memory 310, as shown.

FIG. 3 also shows display controller 326 that is coupled to processor 302 and to display 328. Coder/decoder (CODEC) 334 (e.g., an audio and/or voice CODEC) can be coupled to processor 302. Other components, such as wireless controller 340 (which may include a modem) are also illustrated. Speaker 336 and microphone 338 can be coupled to CODEC 334. FIG. 3 also indicates that wireless controller 340 can be coupled to wireless antenna 342. In a particular aspect, processor 302, display controller 326, memory 310, CODEC 334, and wireless controller 340 are included in a system-in-package or system-on-chip device 322.

In a particular aspect, input device 330 and power supply 344 are coupled to the system-on-chip device 322. Moreover, in a particular aspect, as illustrated in FIG. 3, display 328, input device 330, speaker 336, microphone 338, wireless antenna 342, and power supply 344 are external to the system-on-chip device 322. However, each of display 328, input device 330, speaker 336, microphone 338, wireless antenna 342, and power supply 344 can be coupled to a component of the system-on-chip device 322, such as an interface or a controller.

It should be noted that although FIG. 3 depicts a wireless communications device, processor 302 and memory 310, may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for comparing a first number and a second number using single-ended inputs. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
a first single-ended input comprising n-bits, wherein n is a positive integer;
a second single-ended input comprising n-bits;
a partial match circuit configured to perform a bitwise product of NAND functions of n-bits of the first single-ended input with corresponding n-bits of the second single-ended input to generate a partial match output based only on the first single-ended input and the second single-ended input;
a partial mismatch circuit configured to perform a bitwise summation of NOR functions of n-bits of the first single-ended input with corresponding n-bits of the second single-ended input to generate a partial mismatch output based only on the first single-ended input and the second single-ended input; and
a comparison output circuit configured to perform an AND function of the partial match output and the partial mismatch output to generate a comparison output based on the partial match output and the partial mismatch output.

2. The apparatus of claim 1, wherein the first single-ended input is an inverted version of a first number and the second single-ended input is a true version of a second number, wherein the comparison output comprises a comparison of the first number and the second number.

3. The apparatus of claim 2, wherein the first number comprises a stored address or tag data of a cache and the second number comprises a desired address to be searched in the cache, where the comparison of the first number and the second number is configured to indicate a hit or miss in the cache for the desired address.

4. The apparatus of claim 1, wherein the partial match circuit comprises an n-bit AND gate configured to perform the bitwise product.

5. The apparatus of claim 4, wherein the n-bit AND gate comprises a tree or hierarchical structure of AND gates.

6. The apparatus of claim 1, wherein the NOR functions are implemented with an n-bit OR gate.

7. The apparatus of claim 6, wherein the n-bit OR gate comprises a tree or hierarchical structure of OR gates.

8. The apparatus of claim 1, integrated into a device selected from the group consisting of a set top box, music player, video player, entertainment unit, navigation device, communications device, personal digital assistant (PDA), fixed location data unit, and a computer.

9. A method of comparing, the method comprising:
receiving a first single-ended input comprising n-bits, wherein n is a positive integer;
receiving a second single-ended input comprising n-bits;
performing a bitwise product of NAND functions of n-bits of the first single-ended input with corresponding n-bits of the second single-ended input to generate a partial match output based only on the first single-ended input and the second single-ended input;
performing a bitwise summation of NOR functions of n-bits of the first single-ended input with corresponding n-bits of the second single-ended input to generate a partial mismatch output based only on the first single-ended input and the second single-ended input; and performing an AND function of the partial match output and the partial mismatch output to generate a comparison output based on the partial match output and the partial mismatch output.

10. The method of claim 9, comprising receiving the first single-ended input by inverting a first number and receiving the second single-ended input from a true version of a second number, wherein the comparison output comprises a comparison of the first number and the second number.

11. The method of claim 10, comprising determining the first number from a stored address or tag data of a cache, determining the second number from a desired address to be searched in the cache, and determining an indication of hit or miss in the cache for the desired address based on the comparison of the first number and the second number.

12. The method of claim 9, comprising performing the bitwise product using an n-bit AND gate.

13. The method of claim 9, comprising performing the bitwise summation using an n-bit OR gate.

14. An apparatus comprising:
a first single-ended input comprising n-bits, wherein n is a positive integer;
a second single-ended input comprising n-bits;
means for performing a bitwise product of NAND functions of n-bits of the first single-ended input with corresponding n-bits of the second single-ended input to generate a partial match output based only on the first single-ended input and the second single-ended input;
means for performing a bitwise summation of NOR functions of n-bits of the first single-ended input with corresponding n-bits of the second single-ended input to generate a partial mismatch output based only on the first single-ended input and the second single-ended input; and
means for performing an AND function of the partial match output and the partial mismatch output to generate a comparison output based on the partial match output and the partial mismatch output.

15. The apparatus of claim 14, wherein the first single-ended input is an inverted version of a first number and the second single-ended input is a true version of a second number, wherein the comparison output comprises a comparison of the first number and the second number.

* * * * *